United States Patent

Liou et al.

[11] Patent Number: 6,069,814
[45] Date of Patent: May 30, 2000

[54] MULTIPLE INPUT BUFFERS FOR ADDRESS BITS

[75] Inventors: James H. Liou, Mesquite; Theodore W. Houston, Richardson, both of Tex.

[73] Assignee: Texas Instruments Incorporated, Dallas, Tex.

[21] Appl. No.: 08/371,040

[22] Filed: Jan. 10, 1995

Related U.S. Application Data

[63] Continuation of application No. 08/186,215, Jan. 24, 1994, abandoned, which is a continuation of application No. 08/015,874, Feb. 3, 1993, abandoned, which is a continuation of application No. 07/825,743, Jan. 23, 1992, abandoned, which is a continuation of application No. 07/358,298, May 26, 1989, abandoned.

[51] Int. Cl.[7] .................................. G11C 5/02; G11C 5/06
[52] U.S. Cl. ........................ 365/63; 365/51; 365/230.03; 365/230.08
[58] Field of Search .................................. 395/400, 425, 395/250, 550; 365/189.01, 189.02, 189.03, 230.01, 230.05, 230.08, 230.03, 51, 63; 257/202, 203, 207, 208

[56] References Cited

U.S. PATENT DOCUMENTS

| | | |
|---|---|---|
| 4,038,646 | 7/1977 | Mehta et al. ........................ 340/173 R |
| 4,042,915 | 8/1977 | Reed ................................... 340/173 R |
| 4,389,715 | 6/1983 | Eaton, Jr. et al. ..................... 371/10.3 |
| 4,426,685 | 1/1984 | Lorentzen ................................ 395/550 |
| 4,477,739 | 10/1984 | Proebsting et al. ............... 365/230.06 |
| 4,660,174 | 4/1987 | Takemae et al. ......................... 365/51 |
| 5,007,025 | 4/1991 | Hwang et al. ............................ 365/51 |
| 5,121,354 | 6/1992 | Mandalia ........................... 365/189.02 |
| 5,150,327 | 9/1992 | Matsushima et al. ............. 365/189.01 |
| 5,198,999 | 3/1993 | Abe et al. ......................... 365/189.05 |
| 5,361,223 | 11/1994 | Inoue et al. ............................... 365/51 |

Primary Examiner—Jack A. Lane
Attorney, Agent, or Firm—Jacqueline J. Garner; Wade James Brady; Richard L. Donaldson

[57] ABSTRACT

An input architecture for supply a plurality of signals to a plurality of circuit blocks located in an interior of an integrated circuit device. A plurality of unbuffered signal lines are each connected between a bondpad area and all of a plurality of input buffers. The input buffers are located adjacent to and connected to the plurality of circuit blocks instead of being located at the periphey of the integrated circuit adjacent the bondpad area.

5 Claims, 3 Drawing Sheets

MULTIPLE INPUT BUFFERS FOR ADDRESS BITS

This application is a Continuation of application Ser. No. 08/186,215, filed Jan. 24, 1994, now abandoned, which is a Continuation of Ser. No. 08/015,874, filed Feb. 3, 1993, now abandoned; which is a Continuation of Ser. No. 07/825,743, filed Jan. 23, 1992 now abandoned; which is a Continuation of original Application, Ser. No. 07/358,298, filed May 26, 1989, now abandoned.

BACKGROUND OF THE INVENTION

In circuits, especially memories, there are generally some input signals that are used in multiple sections of the circuit. For instance, in a random access memory, RAM, a typical architecture involves arranging the RAM into blocks such that some address bits are decoded to select a block, while other address bits are decoded to select a column within each of the blocks. In prior art circuits, one input buffer is used per address bit. The input buffer is followed by logic which decodes and drives signals across the integrated circuit chip upon which the memory is located. For instance, for the column decode, the buffered address bits may be decoded (or partially decoded) and the decoded (or partially decoded) signals are driven across the integrated circuit chip to each of the blocks. Alternatively, the buffered address bits may be driven across the bar and the decoding can be done at each block.

FIG. 1a illustrates a schematic diagram of a prior art memory architecture as described above. Five inputs, indicated by a slash mark under the numeral 5 (numerous inputs or outputs will hereinafter be shown as a slash mark through a line adjacent a number indicating the number of inputs or outputs), are received by an input buffer from a bond pad area (the input buffer is typically placed near the chip bond pads). The input buffer sends signals to two pre-decoders PD. Pre-decoders PD are connected to line drivers DR (note that a chain of line drivers may be used) which output information to decoders DC. As shown, decoders DC output 32 lines to each memory block for addressing memory in each block. With reference to FIG. 1b, a schematic drawing of a two-to-four pre-decoder is shown. Signals S1 and S2 are each inverted by an associated inverter 4 and combinations of complemented and uncomplemented signals are NANDed by NAND gates 6 shown, to produce four NAND gate outputs. With reference to FIG. 1c, a schematic diagram of pre-decoder PD, and its associated circuitry, connected to decoder DC of FIG. 1a is illustrated. Inputs are received by the three-to-eight decoder and two-to-four decoder shown and transmitted to individual drivers DR. Each output from the three-to-eight decoder is NANDed with each output from the two-to-four decoder by NAND gates 6. The entire interconnect relationship is not shown. Only a sample of the entire interconnect relationship is illustrated wherein the top driver line of the three-to-eight decoder is NANDed with each two-to-four driver line.

FIG. 1d illustrates another prior art memory architecture wherein five lines from an input buffer are sent to individual drivers DR. These drivers transmit information through five lines each to a five-to-thirty-two decoder DC.

Two major problems with prior art circuits and architectures as described above are the delay in generation and the power consumed in driving long capacitive interconnect lines.

OBJECTS OF THE INVENTION

It is an object of the invention to provide a new and improved input scheme.

It is another object of the invention to provide a new and improved memory architecture.

These and other objects of the invention, together with the features and advantages thereof, will become apparent from the following detailed specification when read together with the accompanying drawings in which applicable reference numerals and letters have been carried forward.

SUMMARY OF THE INVENTION

The foregoing objects of the invention are accomplished by a input scheme wherein at least one input signal on an integrated circuit chip is distributed to multiple input buffers.

In a preferred embodiment of the invention, the input buffers are located in the proximity of where the signal is used.

In a further preferred embodiment of the invention, the input buffers are activated selectively in accordance to when the signal is needed at the associated section of the circuit.

DETAILED DESCRIPTION OF THE INVENTION

Figure 1A:
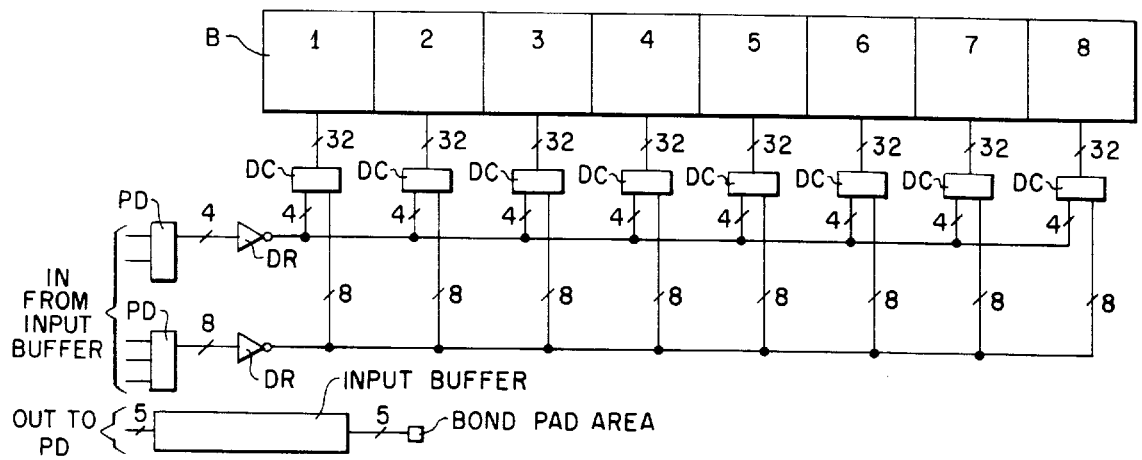
FIG. 1a illustrates a schematic diagram of a prior art memory architecture.
Figure 1B:
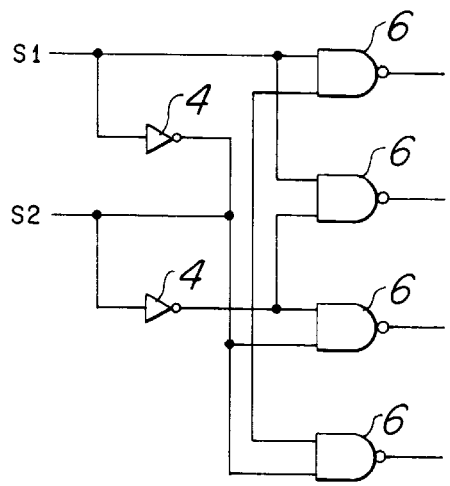
FIG. 1b illustrates a schematic drawing of a prior art two-to-four pre-decoder.
Figure 1C:
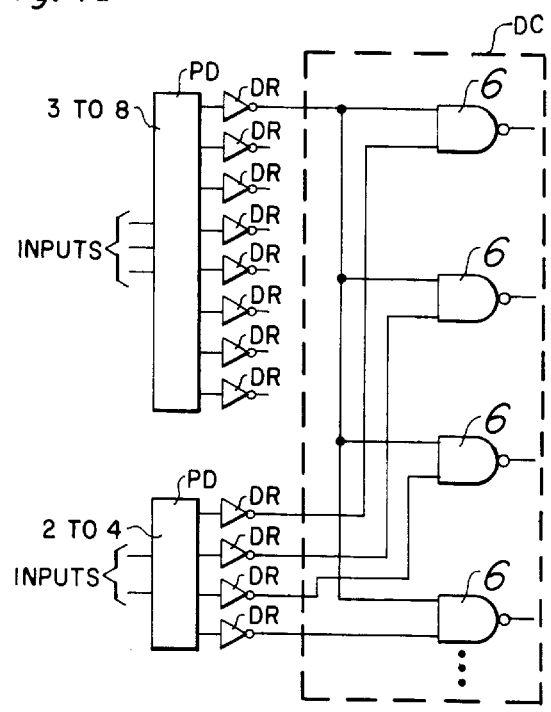
FIG. 1c illustrates a schematic diagram of a prior art pre-decoder and its associated circuitry, connected to a decoder.
Figure 1D:
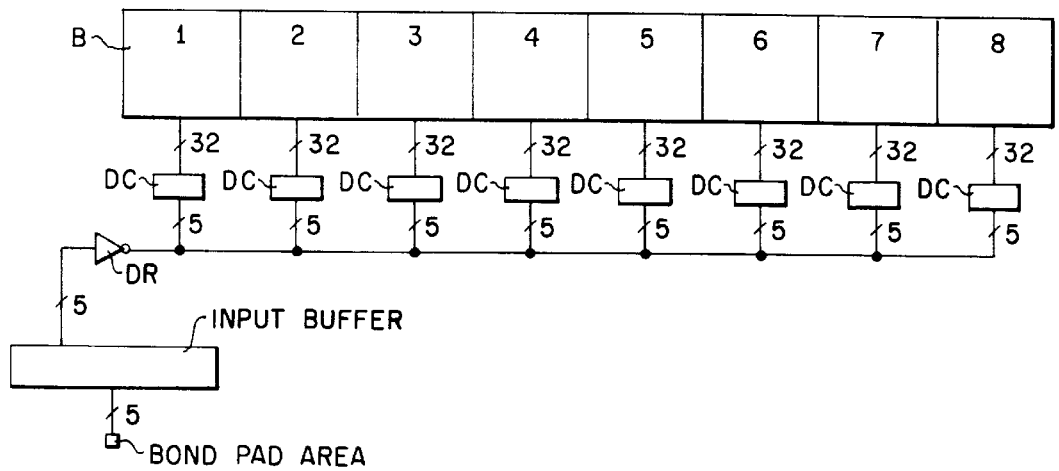
FIG. 1d illustrates another prior art memory architecture.
Figure 2:
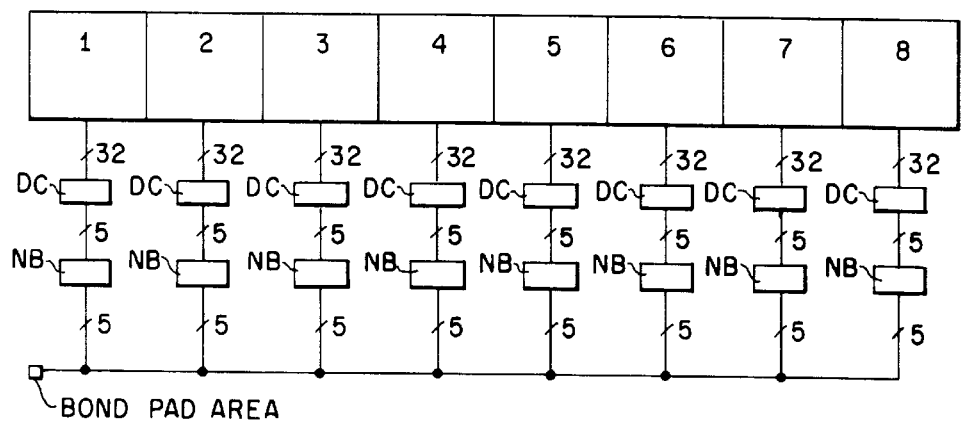
FIG. 2 illustrates a schematic drawing of the invention.

FIG. 2 illustrates a preferred embodiment of the invention. Individual lines from the vicinity of the chip bond pad are received by individual input buffers NB. The five lines of output from each input buffer NB are received by individual decoders DC. Decoders DC decode the five lines of input into thirty-two lines for addressing each memory block.

In the invention, unbuffered address bit line signals are routed across the bar upon which the memory lies and the signals are decoded at each memory block. Input buffer NB at each block is controlled by a block select signal (not shown in FIG. 2) in the same manner that a chip enable signal is normally used to control an input buffer. For instance, all memory blocks are deselected when the chip is deselected. The invention results in superior speed and power performance, over the prior art, and may take advantage of off-chip drivers to drive on chip signals. Any extra on-chip capacitance will generally be insignificant to the off-chip driver, considering the package and circuit board capacitance that are present.

Figure 3:
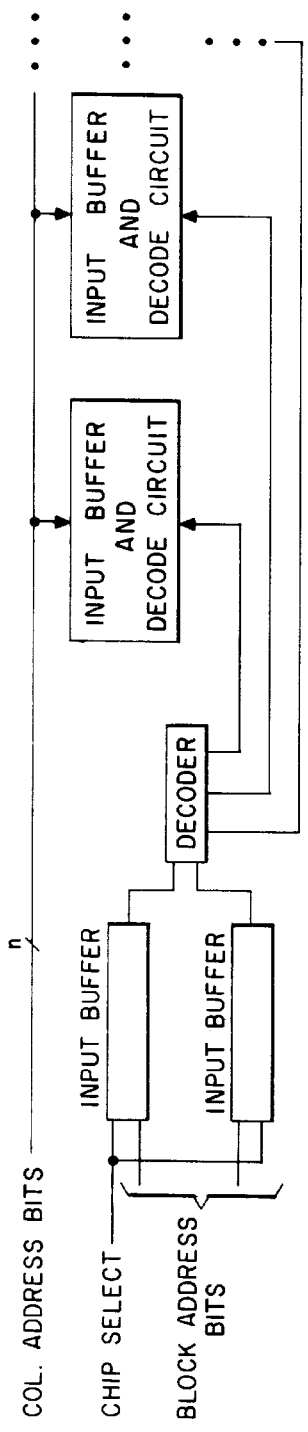
FIG. 3 illustrates a chip select and input buffer configuration.
Figure 4:
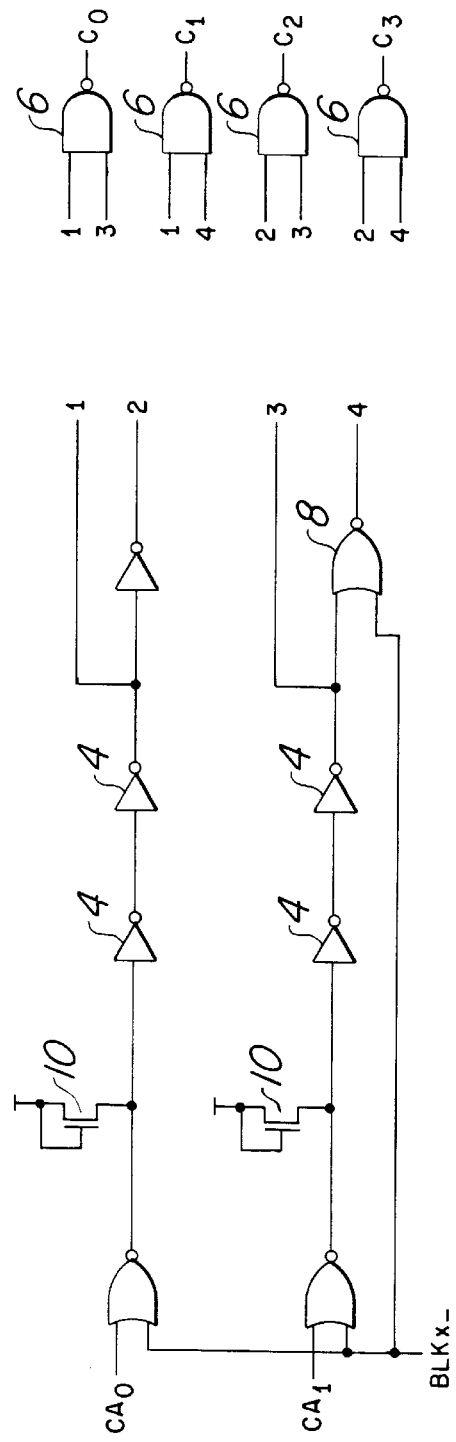
FIG. 4 illustrates a schematic drawing showing the input buffer and decode circuit of FIG. 3.

FIG. 3 illustrates a chip select and input buffer configuration consistent with that described above with respect to driving a column address. As shown, chip select signal and block address bits are received by buffers and sent to a decoder. An input buffer and decode circuit receives input from the decoder and n (n being an integer) column address bits. FIG. 4 illustrates a schematic drawing showing the input buffer and decode circuit of FIG. 3. Column address lines $CA_0$ and $CA_1$, are processed by NOR gates 8, drain-to-gate connected n-channel transistor 10 and inverters 4 in connection with the inverse of a block select signal BLKx__ (x, an integer, indicating the block). Signals 1, 2, 3 and 4, associated with an interim step in processing within the input buffer and decode circuit, are NANDed as shown by NAND gates 6 to produce column address bits $C_0$, $C_1$, $C_2$ and $C_3$.

Note that the invention does not require on-chip drivers to drive signals across the whole bar, although some drivers may optionally be placed at various points in the architecture to boost selected signals.

In an experimental prototype of the invention, a 256K SRAM was divided into four 64K blocks. Sixteen address lines were connected to input buffers at each block. A two-to-four decoder was used to activate input buffers at selected blocks.

Although the invention has been described in detail herein, with reference to its preferred embodiment, it is to be understood that this description is by way of example only, and is not to be construed in the limiting sense. It is to be further understood that numerous changes in the details of the embodiments of the invention, and additional embodiments of the invention, will be apparent to, and may be made by persons of ordinary skill in the art having reference to this description. Note, that although specific examples of line input quantities were shown and discussed, the invention can be used with many more or many less lines of input. Further, while the description is in terms of address bits to a memory array, the invention can be applied to other circuit/signal types, with an input signal routed directly to multiple sections of the circuit. For example, in a memory, the WRITE enable signal can be routed directly to the output buffer to control output enable, and to the data input control logic. Chip Enable is another example of a signal that is often used across most of a chip. It is contemplated that all such changes and additional embodiments are within the true scope and spirit of the invention as claimed below.

We claim:

1. An input architecture for supplying a plurality of signals to a plurality of circuit blocks located in an interior portion of an integrated circuit device, comprising:

a bondpad area;

a plurality of input buffers each located adjacent to and connected to one of said plurality of circuit blocks;

a plurality of unbuffered signal lines, each of said plurality of unbuffered signal lines connected between said bondpad area and all of said plurality of input buffers.

2. The input architecture of claim 1, wherein said plurality of circuit blocks comprise memory blocks.

3. The input architecture of claim 1, wherein said plurality of circuit blocks are decode circuits for a memory array.

4. The input architecture of claim 1, wherein said unbuffered signal lines are unbuffered address lines.

5. A memory device comprising:

a bondpad area;

a memory array divided into a plurality of memory blocks;

a decode circuit for each of said memory blocks, each of said decode circuits located adjacent an associated one of said memory blocks;

a plurality of input buffers, each of said plurality of input buffers located proximate to and connected to one of said decode circuits;

a plurality of unbuffered address lines, each of said plurality of unbuffered address lines being connected between said bondpad area and each of said plurality of input buffers.

* * * * *